(12) United States Patent
Kim (10) Patent No.: US 7,042,774 B2
(45) Date of Patent: May 9, 2006

(54) SEMICONDUCTOR MEMORY DEVICE TO SUPPLY STABLE HIGH VOLTAGE DURING AUTO-REFRESH OPERATION AND METHOD THEREFOR

(75) Inventor: Kwan-Weon Kim, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/881,434

(22) Filed: Jun. 29, 2004

(65) Prior Publication Data

US 2005/0111268 A1 May 26, 2005

(30) Foreign Application Priority Data

Nov. 22, 2003 (KR) ............. 10-2003-0083324

(51) Int. Cl.
*G11C 7/00* (2006.01)
(52) U.S. Cl. ............... 365/189.11; 365/222; 365/194
(58) Field of Classification Search ......... 365/189.11, 365/222, 194
See application file for complete search history.

(56) References Cited

U.S. PATENT DOCUMENTS

| 6,449,204 B1* | 9/2002 | Arimoto et al. ....... 365/189.11 |
| 6,919,756 B1* | 7/2005 | Callaway et al. ........... 327/536 |
| 2003/0214870 A1* | 11/2003 | Cho ........................ 365/222 |

FOREIGN PATENT DOCUMENTS

KR    10-398575 B1    9/2003

* cited by examiner

*Primary Examiner*—Huan Hoang
(74) *Attorney, Agent, or Firm*—Townsend and Townsend and Crew LLP (57) ABSTRACT

A semiconductor device for use in a semiconductor memory device for pumping a supplying voltage according to a data access mode and an auto-refresh mode, including: a voltage level detecting means for generating a voltage level detect signal by detecting a voltage level of the supplying voltage; an auto-refresh signal detecting means for generating an auto-refresh detect signal in response to an auto-refresh signal; and a voltage pumping means for pumping the supplying voltage in response to the voltage level detect signal at the data access mode or in response to the auto-refresh detect signal at the auto-refresh mode.

7 Claims, 9 Drawing Sheets

SEMICONDUCTOR MEMORY DEVICE TO SUPPLY STABLE HIGH VOLTAGE DURING AUTO-REFRESH OPERATION AND METHOD THEREFOR

FIELD OF INVENTION

The present invention relates to a semiconductor memory device; and, more particularly, to a semiconductor memory device which generates a stable high voltage during an auto-refresh operation.

DESCRIPTION OF PRIOR ART

Generally, a dynamic random access memory (DRAM) supplies a high voltage VPP whose voltage level is higher than that of a power supply voltage VDD to a word line during a data access operation or an auto-refresh operation because a power consumption of the DRAM is raised during those operations. Therefore, the DRAM includes a high voltage generating device for generating the high voltage VPP.

Figure 1:
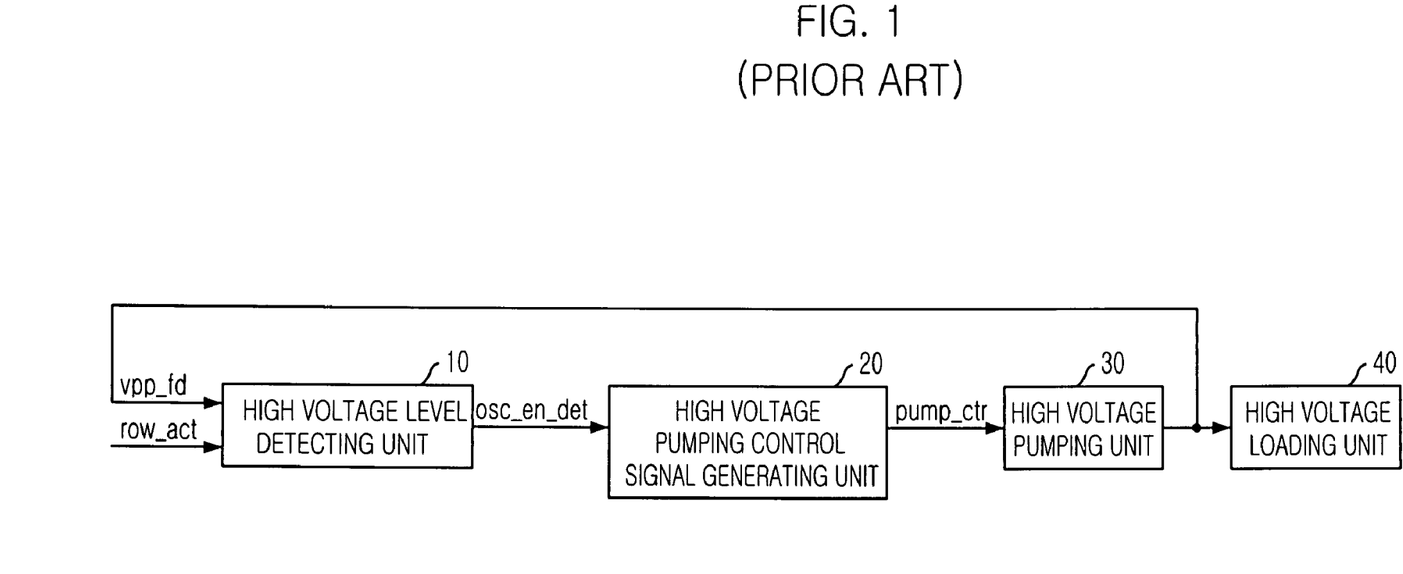
FIG. 1 is a block diagram showing a conventional high voltage generating device included in a semiconductor memory device.

FIG. 1 is a block diagram showing a conventional high voltage generating device included in a semiconductor memory device.

As shown, the conventional high voltage generating device includes a high voltage level detecting unit 10, a high voltage pumping control signal generating unit 20, a high voltage pumping unit 30 and a high voltage loading unit 40.

The high voltage level detecting unit 10 is enabled by a row active signal row_act for detecting a voltage level of a feed-backed high voltage signal vpp_fd, whereby the high voltage level detecting unit 10 generates a voltage level detect signal osc_en_det which is activated when a high voltage VPP is lower than a predetermined voltage level.

The high voltage pumping control signal generating unit 20 generates a pumping control signal pump_ctr in response to the voltage level detect signal osc_en_det.

The high voltage pumping unit 30 generates the high voltage VPP by performing a voltage pumping operation in response to the pumping control signal pump_ctr. The high voltage VPP is feed-backed to the high voltage level detecting unit 10 as the feed-backed high voltage signal vpp_fd.

The high voltage loading unit 40 consumes the high voltage VPP supplied by the high voltage pumping unit 30. Herein, the high voltage loading unit 40 includes any circuit element which consumes the high voltage VPP.

Figure 2:
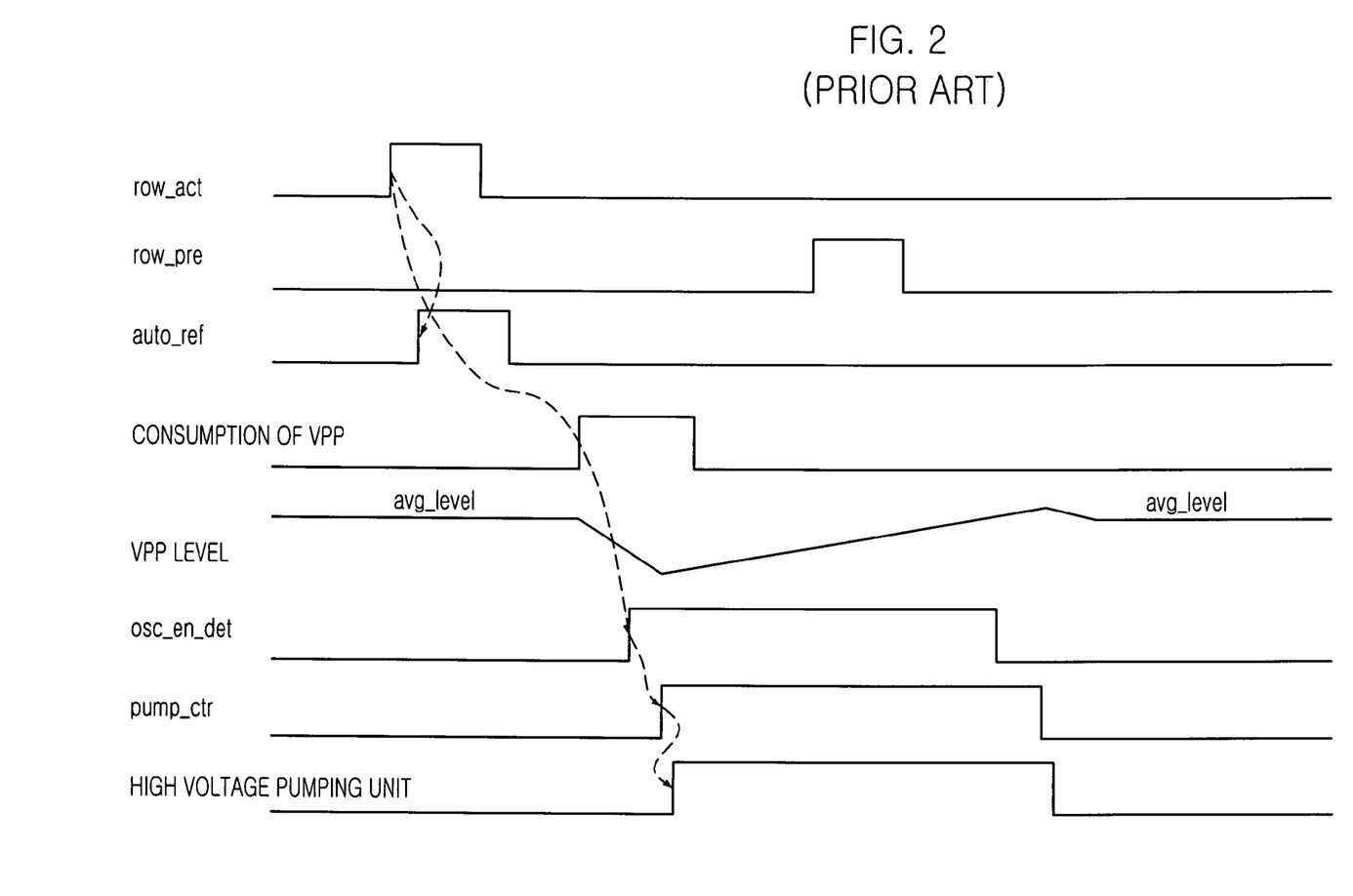
FIG. 2 is a timing diagram showing an operation of the conventional high voltage generating device shown in FIG. 1.

FIG. 2 is a timing diagram showing an operation of the conventional high voltage generating device when performing the auto-refresh operation.

Referring to FIGS. 1 and 2, the operation of the conventional high voltage generating device is described below.

If the row active signal row_act is activated, an auto-refresh signal auto_ref is activated in response to the row active signal row_act.

Thereafter, circuit elements included in the high voltage loading unit 40 perform operations which correspond to various command signals such as a word line signal WL and bit line isolation signals BISH and BISL. Therefore, the high voltage loading unit 40 excessively consumes the high voltage VPP, and, thus, a voltage level of the high voltage VPP is lowered.

If the voltage level of the high voltage VPP becomes lower than an average high voltage level avg_level, the high voltage level detecting unit 10 activates the voltage level detect signal osc_en_det. Then, the high voltage pumping control signal generating unit 20 activates the pumping control signal pump_ctr in response to the voltage level detect signal osc_en_det.

Thereafter, the high voltage pumping unit 30 raises the voltage level of the high voltage VPP by performing a voltage pumping operation, whereby the voltage level of the high voltage VPP becomes the average high voltage level avg_level.

Thereafter, a row precharge signal row_pre is activated, and thus the voltage level detect signal osc_en_det and the pumping control signal pump_ctr are inactivated in response to the row precharge signal row_pre.

Meanwhile, the operation of the conventional high voltage generating device described above is performed when the semiconductor memory device performs an auto-refresh operation. However, the conventional high voltage generating device performs the same operation when the semiconductor memory device performs a data access operation.

Figure 3:
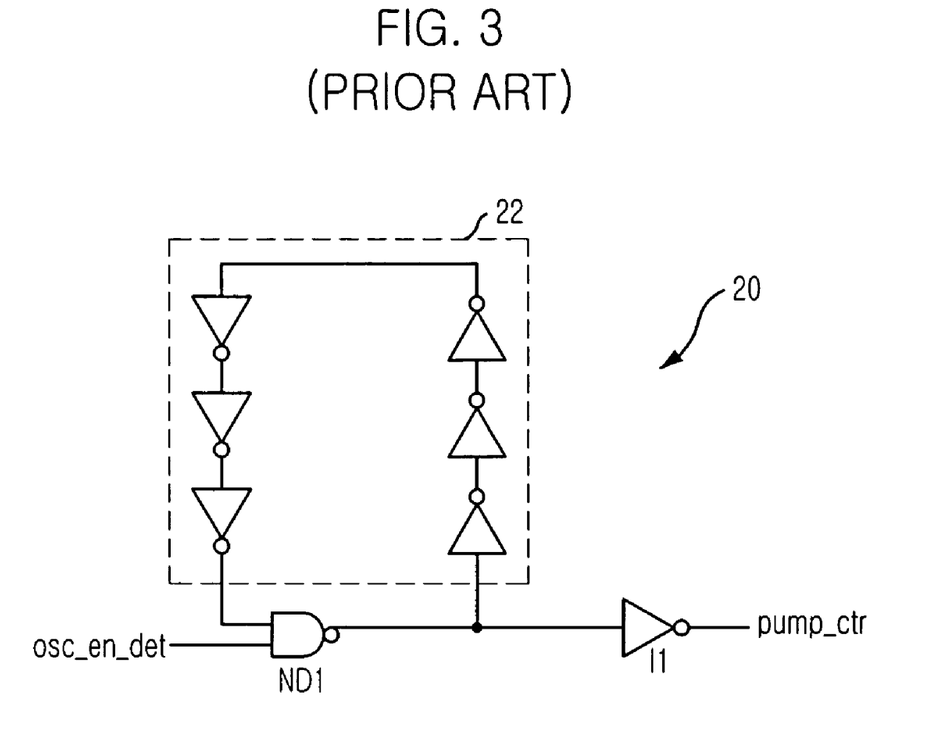
FIG. 3 is a schematic circuit diagram showing a high voltage pumping control signal generating unit shown in FIG. 1.

FIG. 3 is a schematic circuit diagram showing the high voltage pumping control signal generating unit 20.

As shown, the high voltage pumping control signal generating unit 20 includes a NAND gate ND1, a first inverter I1 and an inverter unit 22.

The NAND gate ND1 receives the voltage level detect signal osc_en_det and an output signal from the inverter unit 22 for performing a logic NAND operation to the received two signals.

The inverter unit 22 includes a plurality of inverters connected in series between an input terminal and an output terminal of the NAND gate ND1. The output terminal of the NAND gate ND1 is also connected to an input terminal of the first inverter I1. The inverter unit 22 serves to delay an output signal from the NAND gate ND1.

The first inverter I1 receives an output signal from the NAND gate ND1 and inverts it in order to output the pumping control signal pump_ctr.

The high voltage pumping control signal generating unit 20 activates the pumping control signal pump_ctr in response to the voltage level detect signal osc_en_det. Then, an active state of the pumping control signal pump_ctr is kept for a predetermined delay time corresponding to a delay quantity that the inverter unit 22 has.

That is, the conventional high voltage generating device raises the voltage level of the high voltage VPP if the voltage level of the high voltage VPP is lower than that of the average high voltage level avg_level so that the high voltage VPP can keep its voltage level to be equal to or higher than the average high voltage level avg_level.

However, when the semiconductor memory device performs the auto-refresh operation, the high voltage VPP is excessively consumed because memory banks included in the semiconductor memory device are operated simultaneously. Therefore, the voltage level of the high voltage VPP is more rapidly lowered than it is lowered during the data access operation. Therefore, it is possible that the high voltage loading unit 40 is not supplied an enough power to be normally operated.

SUMMARY OF INVENTION

It is, therefore, an object of the present invention to provide a semiconductor device to supply a stable voltage during an auto-refresh operation.

In accordance with an aspect of the present invention, there is provided a semiconductor device for use in a semiconductor memory device for pumping a supplying voltage according to a data access mode and an auto-refresh mode, including: a voltage level detecting means for generating a voltage level detect signal by detecting a voltage level of the supplying voltage; an auto-refresh signal detecting means for generating an auto-refresh detect signal in response to an auto-refresh signal; and a voltage pumping means for pumping the supplying voltage in response to the voltage level detect signal at the data access mode or in response to the auto-refresh detect signal at the auto-refresh mode.

In accordance with another aspect of the present invention, there is provided a method for pumping a supplying voltage, including a step of: detecting a voltage level of the supplying voltage; raising the voltage level of the supplying voltage if the detected voltage level of the supplying voltage is lower than a predetermined voltage level; and raising the voltage level of the supplying voltage when an auto-refresh signal is activated regardless of the detected voltage level of the high voltage.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 4:
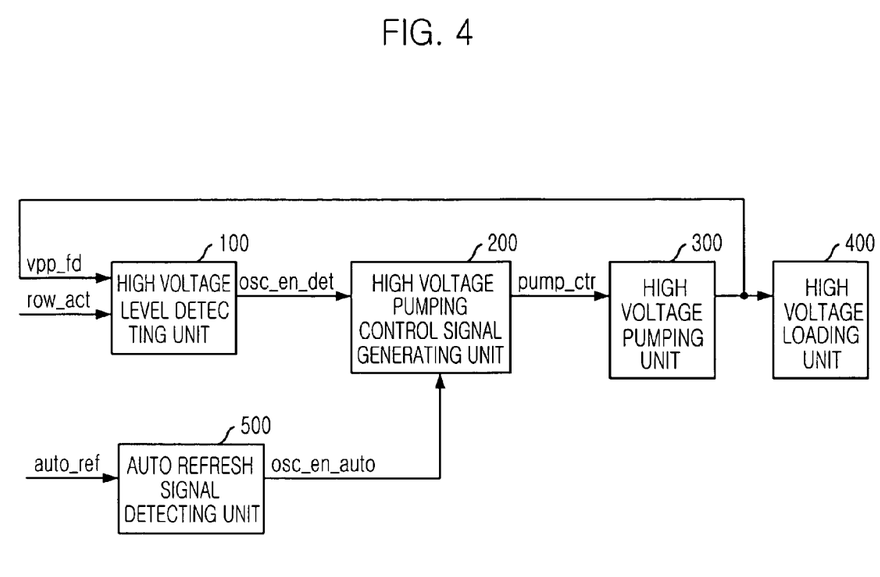
FIG. 4 is a block diagram showing a semiconductor memory device in accordance with the present invention.

FIG. 4 is a block diagram showing a semiconductor memory device in accordance with the present invention.

As shown, the semiconductor memory device includes a high voltage level detecting unit 100, a high voltage pumping control signal generating unit 200, a high voltage pumping unit 300, a high voltage loading unit 400 and an auto-refresh signal detecting unit 500.

The high voltage level detecting unit 100 is enabled by a row active signal row_act for detecting a voltage level of a feed-backed high voltage signal vpp_fd to thereby generate a voltage level detect signal osc_en_det. Herein, the high voltage level detecting unit 100 activates the voltage level detect signal osc_en_det as a logic high level if the voltage level of the feed-backed high voltage signal is lower than a predetermined voltage level, namely an average high voltage level avg_level.

The high voltage pumping control signal generating unit 200 generates a pumping control signal pump_ctr in response to the voltage level detect signal osc_en_det and an auto-refresh detect signal osc_en_auto.

The high voltage pumping unit 300 generates a high voltage VPP by performing a voltage pumping operation in response to the pumping control signal pump_ctr. The high voltage VPP is feed-backed to the high voltage level detecting unit 100 as the feed-backed high voltage signal vpp_fd.

The high voltage loading unit 400 consumes the high voltage VPP supplied by the high voltage pumping unit 300. Herein, the high voltage loading unit 400 includes any circuit elements which consume the high voltage VPP to be operated.

The auto-refresh signal detecting unit 500 receives an auto-refresh signal auto_ref to generate an auto-refresh detect signal osc_en_auto. Herein, the auto-refresh signal detecting unit 500 activates the auto-refresh detect signal osc_en_auto as a logic high level if the auto-refresh signal auto_ref is activated.

Herein, the high voltage pumping unit 300 performs the voltage pumping operation if the pumping control signal pump_ctr is activated as a logic high level for raising a voltage level of the high voltage VPP so that the high voltage VPP can be equal to or higher than the average high voltage level avg_level.

The pumping control signal pump_ctr is activated if one of the voltage level detect signal osc_en_det and the auto-refresh detect signal osc_en_auto is activated. The voltage level detect signal osc_en_det is activated if the voltage level of the high voltage VPP becomes lower than the average high voltage level avg_level. On the other hand, the auto-refresh detect signal osc_en_auto is activated if the auto-refresh signal auto-ref is activated, i.e., if an auto-refresh operation starts to be performed.

Since a semiconductor memory device excessively consumes the high voltage VPP during the auto-refresh operation, the voltage level of the high voltage VPP is rapidly lowered. Therefore, the auto-refresh signal detecting unit 500 activated the auto-refresh detect signal osc_en_auto if the auto-refresh signal auto_ref is activated, whereby the high voltage pumping unit 300 performs the voltage pumping operation. As a result, the voltage level of the high voltage VPP is not rapidly lowered during the auto-refresh operation.

Figure 5:
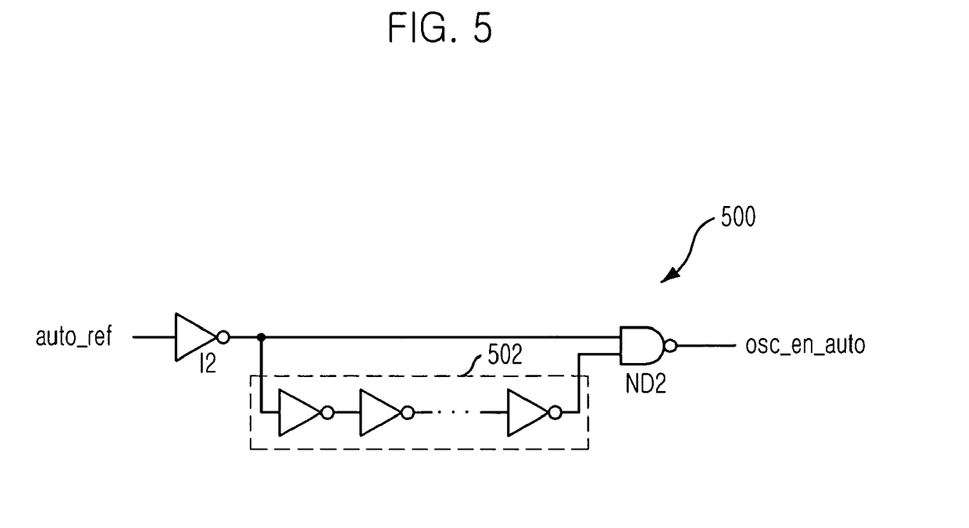
FIG. 5 is a schematic circuit diagram showing an auto-refresh signal detecting unit shown in FIG. 4.

FIG. 5 is a schematic circuit diagram showing the auto-refresh signal detecting unit 500.

As shown, the auto-refresh signal detecting unit 500 includes a first inverter I2, a first NAND gate ND2 and a first delay unit 502.

The first inverter I2 serves to invert the auto-refresh signal auto_ref. The first delay unit 502 includes a plurality of inverters connected in series in order to delay an output signal from the auto-refresh signal auto_ref.

The first NAND gate ND2 receives output signals from the first inverter I2 and the first delay unit 502 for performing a logic NAND operation to the received two signals, whereby the auto-refresh detect signal osc_en_auto is outputted in a pulse shape from the first NAND gate ND2.

The auto-refresh signal detecting unit 500 activates the auto-refresh detect signal osc_en_auto as a logic high level in response to the auto-refresh signal auto_ref. Herein, a logic state of the auto-refresh detect signal osc_en_auto is kept as a logic high level for a predetermined delay time, and the predetermined delay time is determined by the number of the plurality of inverters included in the first delay unit 502.

Figure 6:
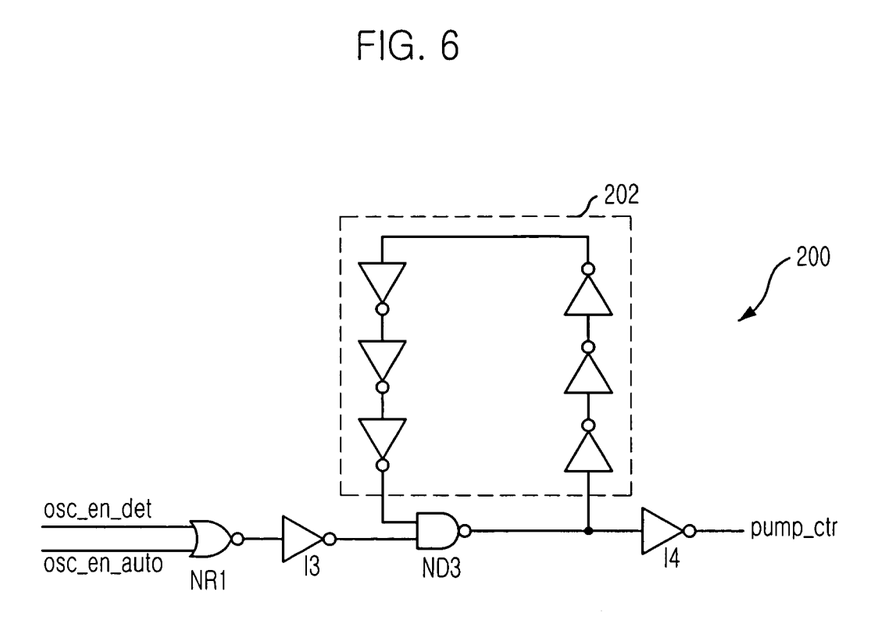
FIG. 6 is a schematic circuit diagram showing a high voltage pumping control signal generating unit shown in FIG. 4.

FIG. 6 is a schematic circuit diagram showing the high voltage pumping control signal generating unit 200.

As shown, the high voltage pumping control signal generating unit 200 includes a NOR gate NR1, a second inverter I3, a third inverter I4, a second NAND gate ND3 and a second delay unit 202.

The NOR gate NR1 receives the voltage level detect signal osc_en_det and the auto-refresh detect signal osc_en_auto for performing a logic NOR operation to the voltage level detect signal osc_en_det and the auto-refresh detect signal osc_en_auto. The second inverter I3 receives a resultant of the logic NOR operation from the NOR gate NR1 to invert the resultant of the logic NOR operation.

The second NAND gate ND3 receives output signals from the second inverter I3 and the second delay unit 202. Herein, the second delay unit 202 delays an output signal from the second NAND gate ND3 and feeds-back the delayed signal to the second NAND gate ND3 for buffering an output signal of the second inverter I3.

The third inverter I4 receives an output signal from the second NAND gate ND3 for inverting the output signal from the second NAND gate ND3, and thus to output the pumping control signal pump_ctr.

The high voltage pumping control signal generating unit 200 activates the pumping control signal pump_ctr when the auto-refresh detect signal osc_en_auto or the voltage level detect signal osc_en_det is activated so that the voltage level of the high voltage VPP can be raised.

Figure 7:
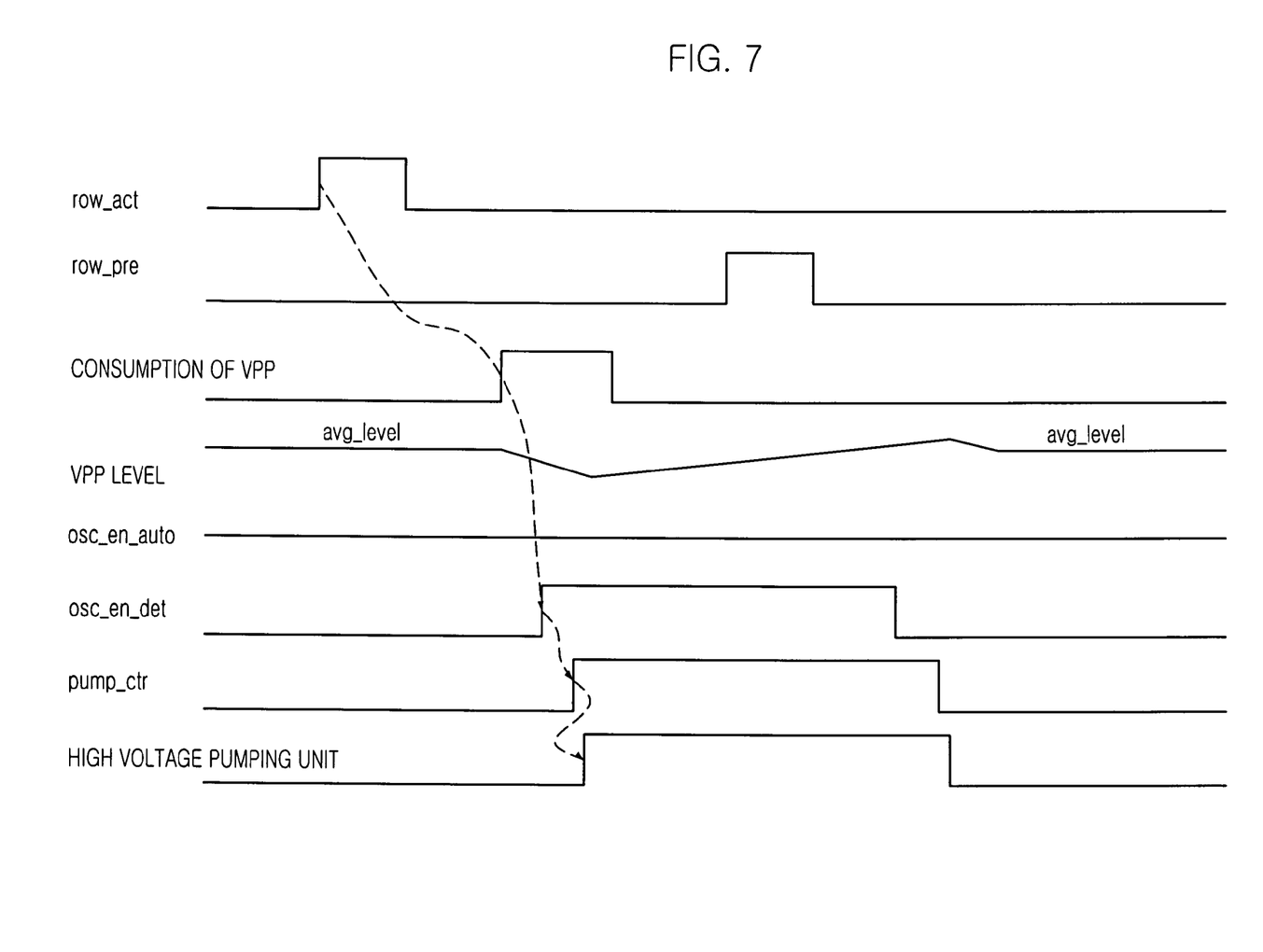
FIG. 7 is a timing diagram showing an operation of the semiconductor memory device when the semiconductor memory device performs a data access operation.

FIG. 7 is a timing diagram showing an operation of the semiconductor memory device when the semiconductor memory device performs a data access operation according to an inputted command.

As shown, when the semiconductor memory device consumes the high voltage VPP for performing the data access operation in response to the row active signal row-act, the voltage level of the high voltage VPP is lowered than the average high voltage level avg_level.

Thereafter, the high voltage level detecting unit 100 activates the voltage level detect signal osc_en_det after detecting that the voltage level of the high voltage VPP is lowered than the average high voltage level avg_level.

Then, the high voltage pumping control signal generating unit 200 activates the pumping control signal pump_ctr in response to the voltage level detect signal osc_en_det. Therefore, the high voltage pumping unit 300 raises the voltage level of the high voltage VPP by performing the voltage pumping operation in response to the pumping control signal pump_ctr. Thereafter, a row precharge signal row_pre is activated.

Herein, since the auto-refresh signal auto_ref is not activated, the auto-refresh signal detecting unit 500 is not enabled.

Figure 8:
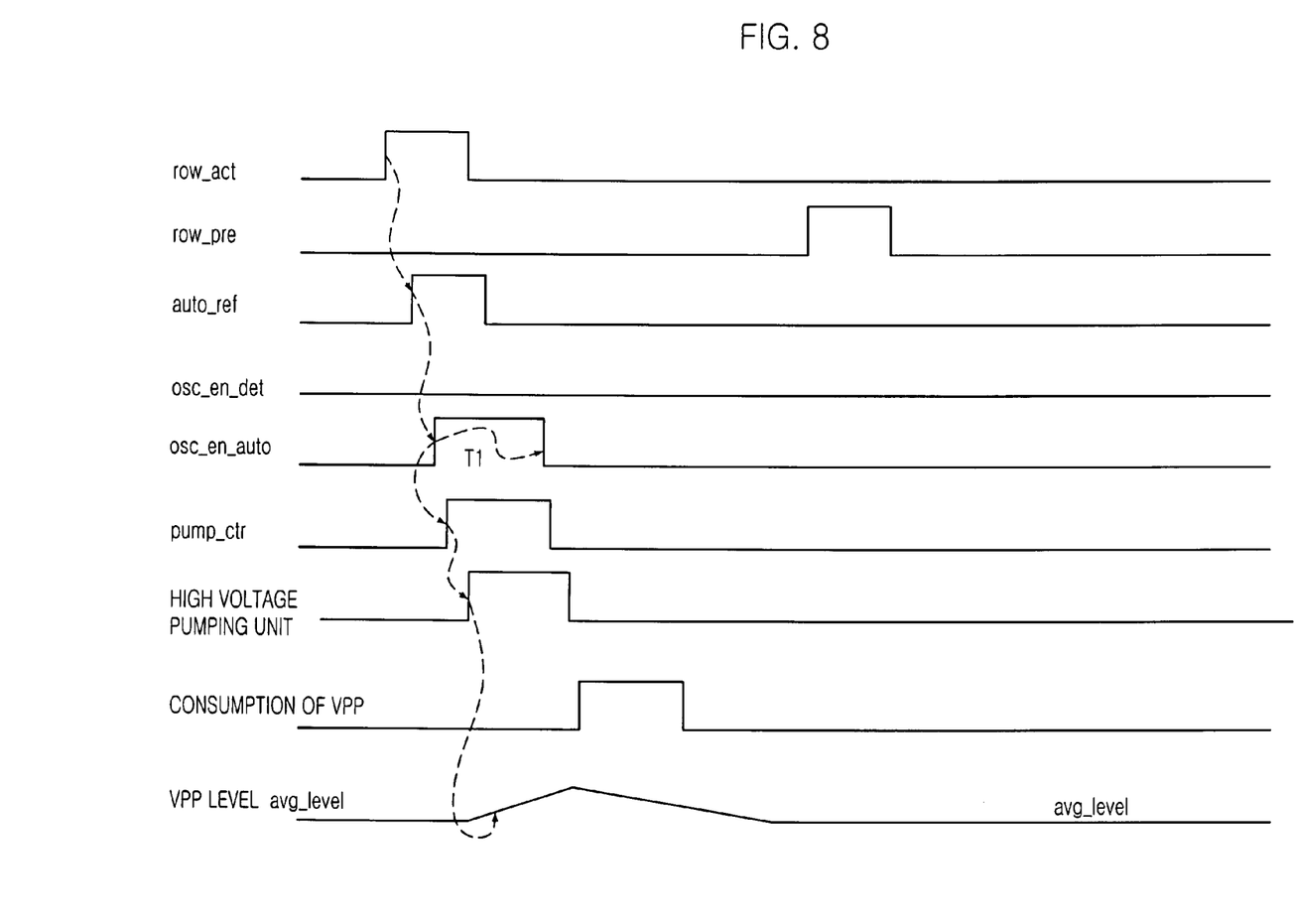
FIG. 8 is a timing diagram showing an operation of the semiconductor memory device when the semiconductor memory device performs an auto-refresh operation.

FIG. 8 is a timing diagram showing an operation of the semiconductor memory device when the semiconductor memory device performs the auto-refresh operation.

As shown, the auto-refresh signal auto_ref is activated in response to the row active signal row_act.

Thereafter, the auto-refresh signal detecting unit 500 actives the auto-refresh detect signal osc_en_auto. Herein, the auto-refresh detect signal osc-en_auto is activated for a first predetermined activation time T1. Then, the high voltage pumping control signal generating unit 200 activates the pumping control signals pump_ctr. The first predetermined activation time T1 is determined by the number of the plurality of inverters included in the first delay unit 502 of the auto-refresh signal detecting unit 500.

Therefore, the high voltage pumping unit 300 raises the voltage level of the high voltage VPP by performing the voltage pumping operation in response to the pumping control signal pump_ctr. Thereafter, as the high voltage loading unit 400 consumes the high voltage VPP in order to perform operations which correspond to command signals such as a world line signal WL and bit line isolation signals BISH and BISL for performing the auto-refresh operation, the voltage level of the high voltage VPP starts to be lowered. However, since the voltage level of the high voltage VPP is raised before the auto-refresh operation is performed, the voltage level of the high voltage VPP is not lowered below the average high voltage level avg_level.

Figure 9:
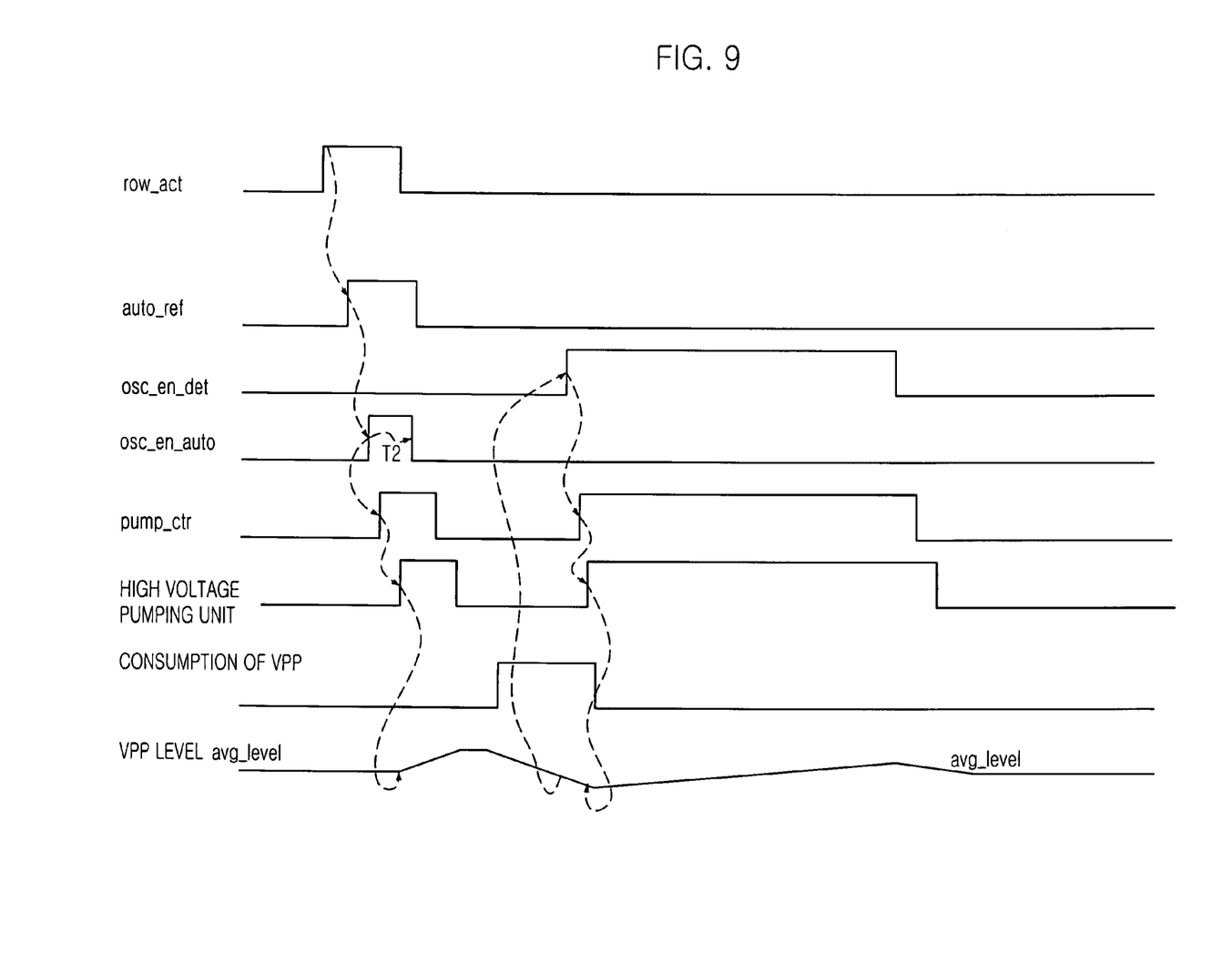
FIG. 9 is a timing diagram showing another operation of the semiconductor memory device when the semiconductor memory device performs an auto-refresh operation.

FIG. 9 is a timing diagram showing another operation of the semiconductor memory device when the semiconductor memory device performs the auto-refresh operation.

In this case, the auto-refresh signal detecting unit 500 actives the auto-refresh detect signal osc_en_auto, and the auto-refresh detect signal osc_en_auto is activated for a second predetermined activation time T2. Then, the high voltage pumping control signal generating unit 200 activates the pumping control signal pump_ctr. Like the first predetermined activation time T1, the second predetermined activation time T2 is determined by the number of the plurality of inverters included in the first delay unit 502 of the auto-refresh signal detecting unit 500.

However, the number of the plurality of inverters included in the first delay unit 502 for the operation shown in FIG. 9 is smaller than that for the operation shown in FIG. 8. Therefore, the second predetermined activation time T2 is shorter than the first predetermined activation time T1.

As shown in FIG. 9, the voltage level of the high voltage VPP is lowered than the average high voltage level avg_level while the semiconductor memory device consumes the high voltage VPP for performing the auto-refresh operation.

However, since the high voltage level detecting unit 100 activates the voltage level detect signal osc_en_det, the voltage level of the high voltage VPP is raised to the average high voltage level avg_level again.

Herein, although the voltage level of the high voltage VPP is lowered than the average high voltage level avg_level, the high voltage VPP is raised to the average high voltage level avg_level fast compared to that of the conventional high voltage generating device because the voltage pumping operation is performed prior to consumption of the high voltage VPP.

Therefore, the semiconductor memory device in accordance with the present invention can supply a stable high voltage by raising the voltage level of the high voltage VPP before consumption of the high voltage VPP for the auto-refresh operation.

The present application contains subject matter related to Korean patent application No. 2003-83324, filed in the Korean Patent Office on Nov. 22, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An apparatus for use in a semiconductor memory device for pumping a supplying voltage according to a data access mode and an auto-refresh mode, comprising:
    a voltage level detecting means for generating a voltage level detect signal by detecting a voltage level of the supplying voltage;
    an auto-refresh signal detecting means for generating an auto-refresh detect signal having an adjustable activation period in response to an activation time of an auto-refresh signal; and
    a voltage pumping means for pumping the supplying voltage in response to the voltage level detect signal at the data access mode or in response to the auto-refresh detect signal at the auto-refresh mode.

2. The apparatus as recited in claim 1, wherein pumping of the supplying voltage is performed after the supplying voltage is consumed at the data access mode or before the supplying voltage is consumed at the auto-refresh mode.

3. The apparatus as recited in claim 2, wherein the voltage level detecting means activates the voltage level detect signal when a voltage level of the supplying voltage is lower than a predetermined voltage level.

4. The apparatus as recited in claim 3, wherein the auto-refresh signal detecting means includes:
    a first inverter for inverting the auto-refresh signal;
    a plurality of inverters connected in series for inverting and delaying an output signal of the first inverter; and
    a first NAND gate which receives output signals of the first inverter and the plurality of inverters for performing a logic NAND operation in order to output the auto-refresh detect signal.

5. The apparatus as recited in claim 4, wherein the voltage pumping means includes:
    a voltage pumping control signal generating unit for generating a voltage pumping control signal in response to the voltage level detect signal and the auto-refresh detect signal; and
    a voltage pumping unit for pumping the supplying voltage in response to the voltage pumping control signal.

6. The apparatus as recited in claim 5, wherein the voltage pumping control signal generating unit includes:
    a NOR gate which receives the voltage level detect signal and the auto-refresh detect signal;
    a second inverter for inverting an output signal of the NOR gate;
    a second NAND gate which receives output signals of the second inverter and a plurality of inverters; and a third inverter which receives an output signal of the second NAND gate for outputting the voltage pumping control signal.

7. A method for pumping a supplying voltage, comprising a step of:
    detecting a voltage level of the supplying voltage;
    raising the voltage level of the supplying voltage if the detected voltage level of the supplying voltage is lower than a predetermined voltage level;
    raising the voltage level of the supplying voltage when an auto-refresh signal is activated regardless of the detected voltage level of the supplying voltages;
    activating an auto-refresh detect signal in response to the auto-refresh signal, wherein the auto-refresh signal has an adjustable activated period in response to a timing of activating the auto-refresh signal; and
    performing a voltage pumping operation for raising the voltage level of the supplying voltage while the auto-refresh detect signal is activated.

* * * * *